United States Patent
Saxena et al.

(10) Patent No.: US 8,996,960 B1
(45) Date of Patent: Mar. 31, 2015

(54) VERTICAL ERROR CORRECTION CODE FOR DRAM MEMORY

(71) Applicant: Inphi Corporation, Santa Clara, CA (US)

(72) Inventors: Nirmal Raj Saxena, Santa Clara, CA (US); David Wang, Westlake Village, CA (US); Hamid Rategh, Westlake Village, CA (US); Lawrence Tse, Santa Clara, CA (US)

(73) Assignee: Inphi Corporation, Santa Clara, CA (US)

( * ) Notice: Subject to any disclaimer, the term of this patent is extended or adjusted under 35 U.S.C. 154(b) by 95 days.

(21) Appl. No.: 13/797,583

(22) Filed: Mar. 12, 2013

Related U.S. Application Data

(60) Provisional application No. 61/664,373, filed on Jun. 26, 2012.

(51) Int. Cl.
*G11C 29/00* (2006.01)
*H03M 13/17* (2006.01)

(52) U.S. Cl.
CPC ................................... *H03M 13/17* (2013.01)
USPC .......................................................... 714/773

(58) Field of Classification Search
CPC ............ G06F 11/1068; G06F 11/1072; G06F 11/1008; G06F 11/1076; G11C 29/00
USPC .......................................................... 714/773
See application file for complete search history.

(56) References Cited

U.S. PATENT DOCUMENTS

| | | | | |
|---|---|---|---|---|
| 4,608,692 | A  * | 8/1986 | Nagumo et al. | 714/756 |
| 8,091,010 | B2 * | 1/2012 | Yim | 714/773 |
| 8,539,312 | B2 * | 9/2013 | Hargan | 714/766 |
| 2006/0123320 | A1 * | 6/2006 | Vogt | 714/762 |
| 2006/0200723 | A1 * | 9/2006 | Carnevale et al. | 714/758 |
| 2008/0010435 | A1 * | 1/2008 | Smith et al. | 712/10 |
| 2009/0085604 | A1 * | 4/2009 | David | 326/30 |
| 2009/0164704 | A1 * | 6/2009 | Kanade et al. | 711/103 |
| 2014/0157085 | A1 * | 6/2014 | Shalvi et al. | 714/768 |

* cited by examiner

*Primary Examiner* — Albert Decady
*Assistant Examiner* — Enam Ahmed
(74) *Attorney, Agent, or Firm* — Richard T. Ogawa; Ogawa P.C.

(57) ABSTRACT

Techniques for operating a DIMM apparatus. The apparatus comprises a plurality of DRAM devices numbered from 0 through N−1, where N is an integer greater than seven (7), each of the DRAM devices is configured in a substrate module; a buffer integrated circuit device comprising a plurality of data buffers (DB) numbered from 0 through N−1, where N is an integer greater than seven (7), each of the data buffers corresponds to one of the DRAM devices; and a plurality of error correcting modules ("ECMs") associated with the plurality of DRAM devices.

20 Claims, 6 Drawing Sheets

US 8,996,960 B1

VERTICAL ERROR CORRECTION CODE FOR DRAM MEMORY

CROSS-REFERENCE TO RELATED APPLICATIONS

The present invention is a non-provisional of U.S. Provisional Application No. 61/664,373 filed Jun. 26, 2012, which is incorporated by reference herein for all purposes.

BACKGROUND OF THE INVENTION

The present invention relates generally to memory systems, and more particularly to computer systems which include memories systems with error correction.

Traditional computer systems, such as servers, workstations, desktops and laptops, all use pluggable memory which can be inserted into slots on the computer's motherboard as needed. The most common form of pluggable memory is the Dual In-line Memory Module (DIMM). Historically, DIMMs contain multiple RAM chips—typically DRAM—each of which has a data bus width of 4 or 8 bits. Typically, eight or nine 8-bit DRAM chips (or twice as many 4-bit DRAM chips) are arranged in parallel to provide each DIMM with a total data bus width of 64 or 72 bits; the data bus, typically referred to as the 'DQ' bus, is connected to a host controller. Each arrangement of 64 or 72 data bits using DRAM chips in parallel is termed a 'rank'.

A command/address (CA) bus also runs between the host controller and each DIMM; the CA and DQ busses together form a 'system' bus. With a basic unbuffered DIMM, the CA bus is connected to every DRAM on the DIMM. As a result, there is a high electrical load on the CA bus, given by the product of the number of DRAMs times the number of ranks. For the DQ bus, the number of electrical loads is equal to the number of ranks.

A buffering device is employed to reduce loading in a 'load reduction' DIMM (LR-DIMM), as an example. An LR-DIMM containing multiple DRAM chips uses a logic device to buffer the DQ and CA signals between the DRAMs and a host controller. Logic device may be, for example, a single device such as the iMB (isolating Memory Buffer) from Inphi Corporation. Memory systems of this sort are described, for example, in co-pending U.S. patent application Ser. Nos. 12/267,355 and 12/563,308, which are incorporated herein by reference, for all purposes.

SUMMARY OF INVENTION

The present invention relates generally to memory systems, and more particularly to computer systems which include memories systems with error correction. Merely by way of example, the present invention provides an architectural approach, called Vertical error correction codes (Vertical ECC), for use in designing DRAM memory systems. Error correction coding is a well-studied area of research and has been applied in computer memory system design [1]. In an example, the focus of this invention is not on the design of new codes but more on a new system architectural application of well-known codes.

In an example, the present invention provides a DIMM apparatus. The apparatus has a plurality of DRAM devices numbered from 0 through N−1, where N is an integer greater than seven (7), each of the DRAM devices is configured in a substrate module. The apparatus has a buffer integrated circuit device comprising a plurality of data buffers (DB) numbered from 0 through N−1, where N is an integer greater than seven (7), each of the data buffers corresponds to one of the DRAM devices. The apparatus has a plurality of error correcting modules ("ECMs") associated with the plurality of data buffers, respectively, each of error correcting modules configured within each of the data buffers, each error correcting module being configured to correct a single or double bit error within each DRAM device.

In an example, he ECM is configured to associate error correcting check bits with one or more bursts from or to the DRAM device. In an example, the ECM is configured to associate error correcting check bits with one or more bursts from or to the DRAM device; and wherein the DB encode and decode a plurality of data bursts comprising actual data and error correcting check bits. In an example, N is equal to 8; and wherein the ECM is configured to associate error check bits from two bursts from or to the DRAM device; the two bursts being two out of ten eight bit bursts to be characterized by a double error correcting (DEC) and triple error detecting (TED) capability. In an example, N is equal to 8; and wherein the ECM is configured to associate error check bits from two bits from each burst having ten bits to and from the DRAM device, each burst being one of eight bursts to and from the DRAM device; the eight bursts of ten bits to be characterized by a double error correcting (DEC) and triple error detecting (TED) capability. In an example, N is equal to 8; and wherein the ECM is configured to associate error check bits from two bits from each burst having ten bits to and from the DRAM device, each burst being one of eight bursts to and from the DRAM device; the eight bursts of ten bits to be characterized by a double error correcting (DEC) and triple error detecting (TED) capability.

In an example, the present invention provides a DIMM apparatus. The apparatus has a plurality of DRAM devices numbered from 0 through N−1, where N is an integer greater than seven (7), each of the DRAM devices is configured in a substrate module. The apparatus has a buffer integrated circuit device comprising a plurality of data buffers (DB) numbered from 0 through N−1, where N is an integer greater than seven (7), each of the data buffers corresponds to one of the DRAM devices. The apparatus has a plurality of error correcting modules ("ECMs") associated with the plurality of DRAM devices, respectively, each of error correcting modules configured within each of the DRAM devices, each error correcting module being configured to correct a single or double bit error within each DRAM device.

In an alternative example, the invention has a DIMM apparatus. The apparatus has a plurality of DRAM devices numbered from 0 through N−1, where N is an integer greater than seven (7), each of the DRAM devices is configured in a substrate module. The apparatus has a buffer integrated circuit device comprising a plurality of data buffers (DB) numbered from 0 through N−1, where N is an integer greater than seven (7), each of the data buffers corresponds to one of the DRAM devices. The apparatus has a plurality of error correcting modules ("ECMs") associated with the plurality of DRAM devices, respectively, each of error correcting modules configured within a memory controller device, each error correcting module being configured to correct a single or double bit error within each DRAM device.

In an alternative example, the present invention provides a method for operating a DIMM apparatus. The apparatus comprising a plurality of DRAM devices numbered from 0 through N−1, where N is an integer greater than seven (7), each of the DRAM devices is configured in a substrate module; a buffer integrated circuit device comprising a plurality of data buffers (DB) numbered from 0 through N−1, where N is an integer greater than seven (7), each of the data buffers corresponds to one of the DRAM devices; and a plurality of error correcting modules ("ECMs") associated with the plurality of data buffers, respectively, each of error correcting modules configured within each of the data buffers, each error correcting module being configured to correct a single or double bit error within each DRAM device. Preferably, the method comprises transferring one or more check bits with one or more bursts from or to the DRAM device; and encoding and decoding a plurality of data bursts comprising actual data and the error correcting check bits.

In an alternative example, the present invention provides a method for operating a DIMM apparatus comprising a plurality of DRAM devices numbered from 0 through N−1, where N is an integer greater than seven (7), each of the DRAM devices is configured in a substrate module; a buffer integrated circuit device comprising a plurality of data buffers (DB) numbered from 0 through N−1, where N is an integer greater than seven (7), each of the data buffers corresponds to one of the DRAM devices; and a plurality of error correcting modules ("ECMs") associated with the plurality of DRAM devices, respectively, each of error correcting modules configured within each of the DRAM devices. Preferably, the method comprises correcting a single or double bit error within each DRAM device.

In an alternative example, the invention provides a method for operating a DIMM apparatus comprising: a plurality of DRAM devices numbered from 0 through N−1, where N is an integer greater than seven (7), each of the DRAM devices is configured in a substrate module; a buffer integrated circuit device comprising a plurality of data buffers (DB) numbered from 0 through N−1, where N is an integer greater than seven (7), each of the data buffers corresponds to one of the DRAM devices; and a plurality of error correcting modules ("ECMs") associated with the plurality of DRAM devices, respectively, each of error correcting modules configured within a memory controller device. Preferably, the method comprises correcting a single or double bit error within each DRAM device.

These and other features, aspects, and advantages of the present invention will become better understood with reference to the following description and claims.

DETAILED DESCRIPTION OF THE SPECIFIC OF THE EMBODIMENTS

The scaling of silicon transistor and process technology as applied to DRAM devices has contributed significantly in improving performance and memory capacity; however, it also appears to be having a detrimental impact on the reliability of memory cells. This impact on reliability manifests itself in terms of greater susceptibility to radiation-induced soft-errors called single-event upsets (SEUs) and in a new defect phenomenon called weak-cells. Both SEUs and weak-cell events compromise the ability of a DRAM memory cell to reliably hold bit values.

Figure 1:
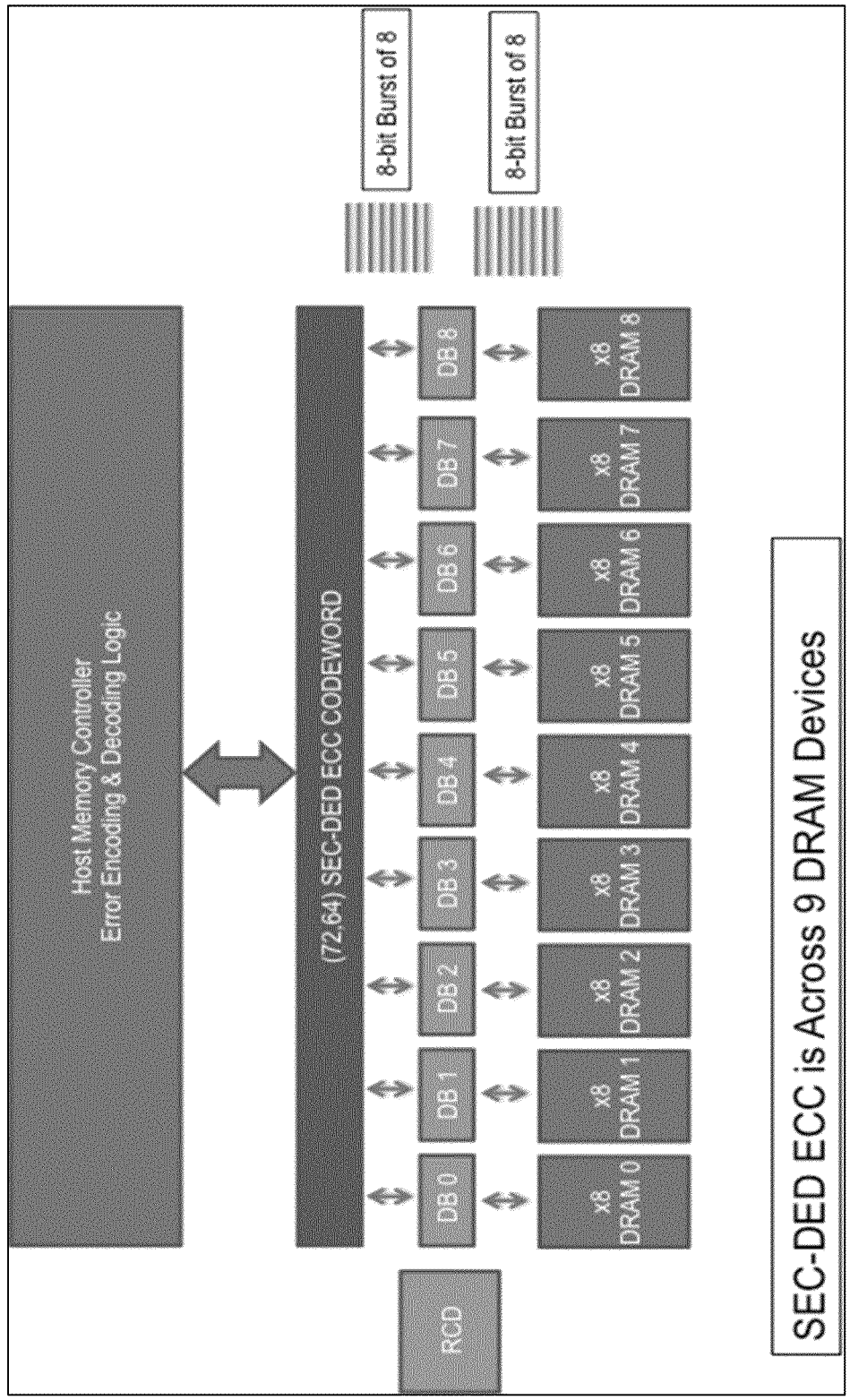
FIG. 1 shows a conventional method of providing error correction capability across multiple DRAM devices with coding and encoding done at the host memory controller.

DRAM memory systems would desire an architectural approach to mitigate the reliability impact of silicon process technology scaling. FIG. 1 shows a conventional method of providing error correction capability across multiple DRAM devices with coding and encoding done at the host memory controller. In order to distinguish this traditional method from our present "Vertical" ECC method, we will call this the Horizontal ECC method. In general, Horizontal ECC methods have provided single-error correct and double-error correct (SEC-DED) [1] capability. One of the advantages of the Horizontal ECC method is that it does not require any specific ECC related changes in the DRAM device architecture. The error correcting capability in the Horizontal ECC is accomplished by using redundant DRAM devices. For example, in FIG. 1 nine ×8 DRAM devices are used instead of eight ×8 DRAM devices. To further improve error correction capability, Horizontal ECC can be augmented to provide double-error correct and triple-error detect (DEC-TED) [1] codes. However, the system architecture would now require ten ×8 DRAM devices.

In summary, scaling the performance of the Horizontal ECC method entails changes in system memory interface and the host memory controller architecture. This would have a major infrastructure impact. In other words, host memory controller interface level changes would be required to support different correction capability requirements. Since the Horizontal ECC method always requires redundant devices, in system architectures that have fewer DRAM devices the overhead of an additional redundant device can become significant. For example, in a memory system with a 16-bit data interface, Horizontal ECC would require an additional ×8 DRAM (still not providing DEC-TED capability), making the overhead 50%.

Figure 2:
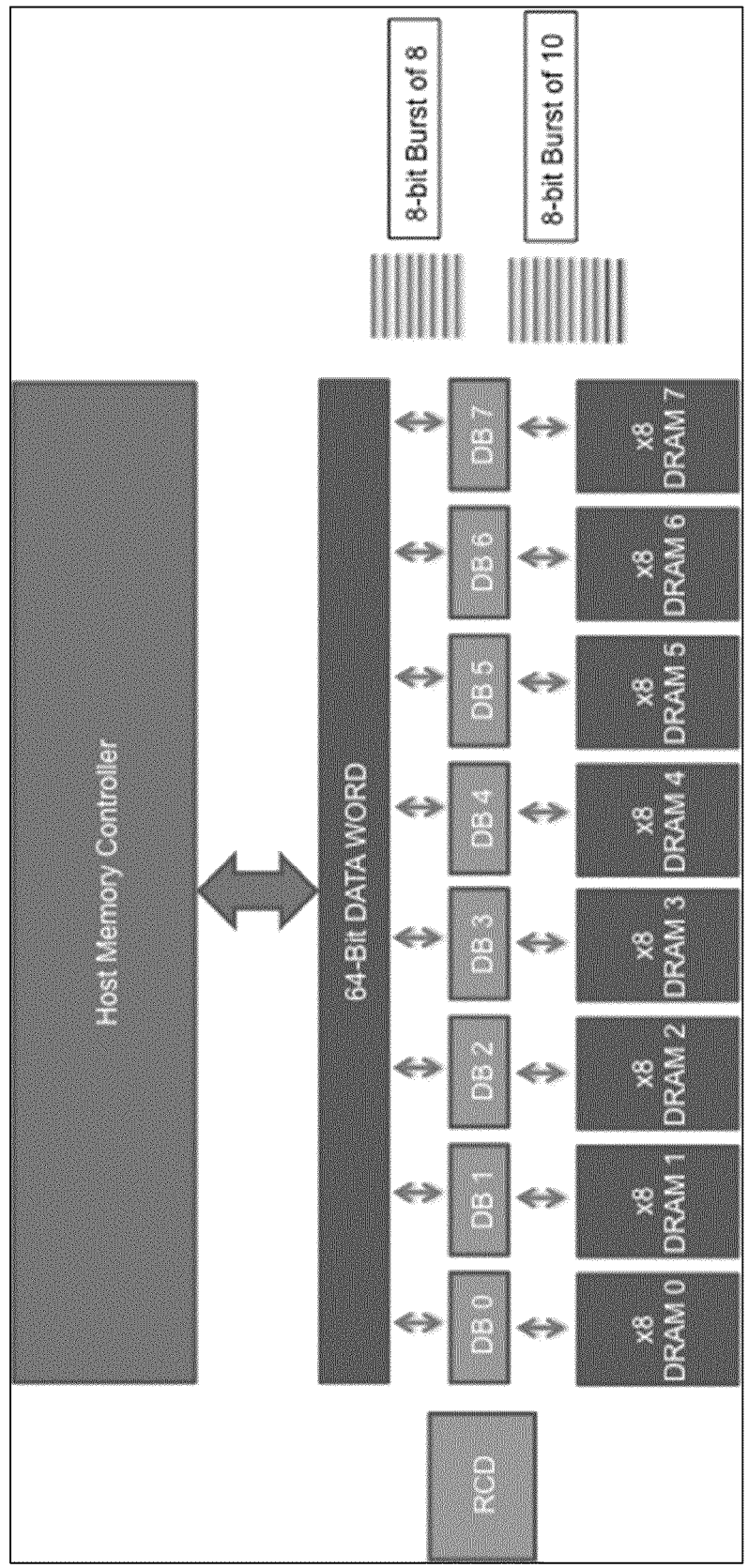
FIGS. 2 through 4 present four different system architectural implementation options (Option 1 through Option 4) for Vertical ECC according to embodiments of the present invention.
Figure 3:
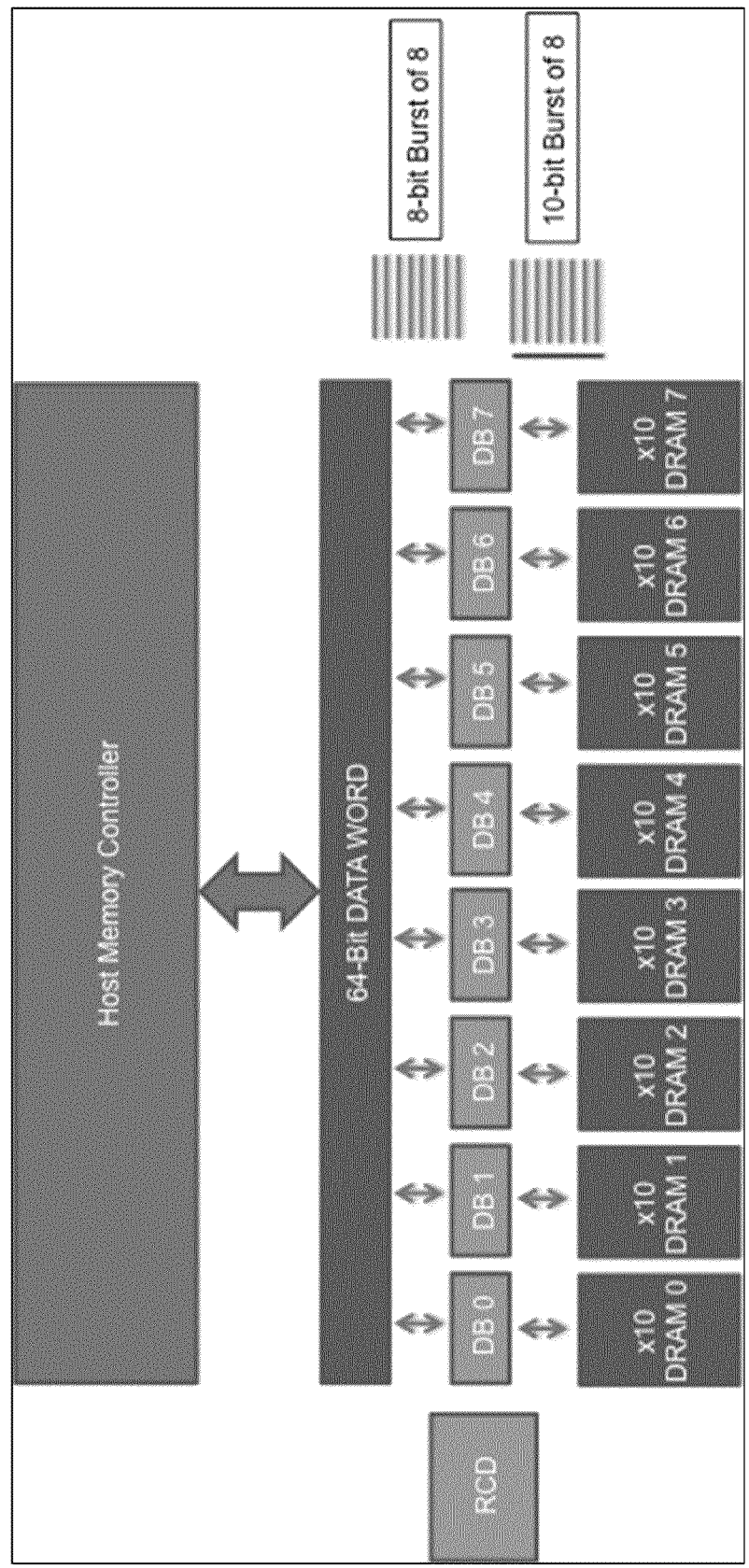
Figure 4:
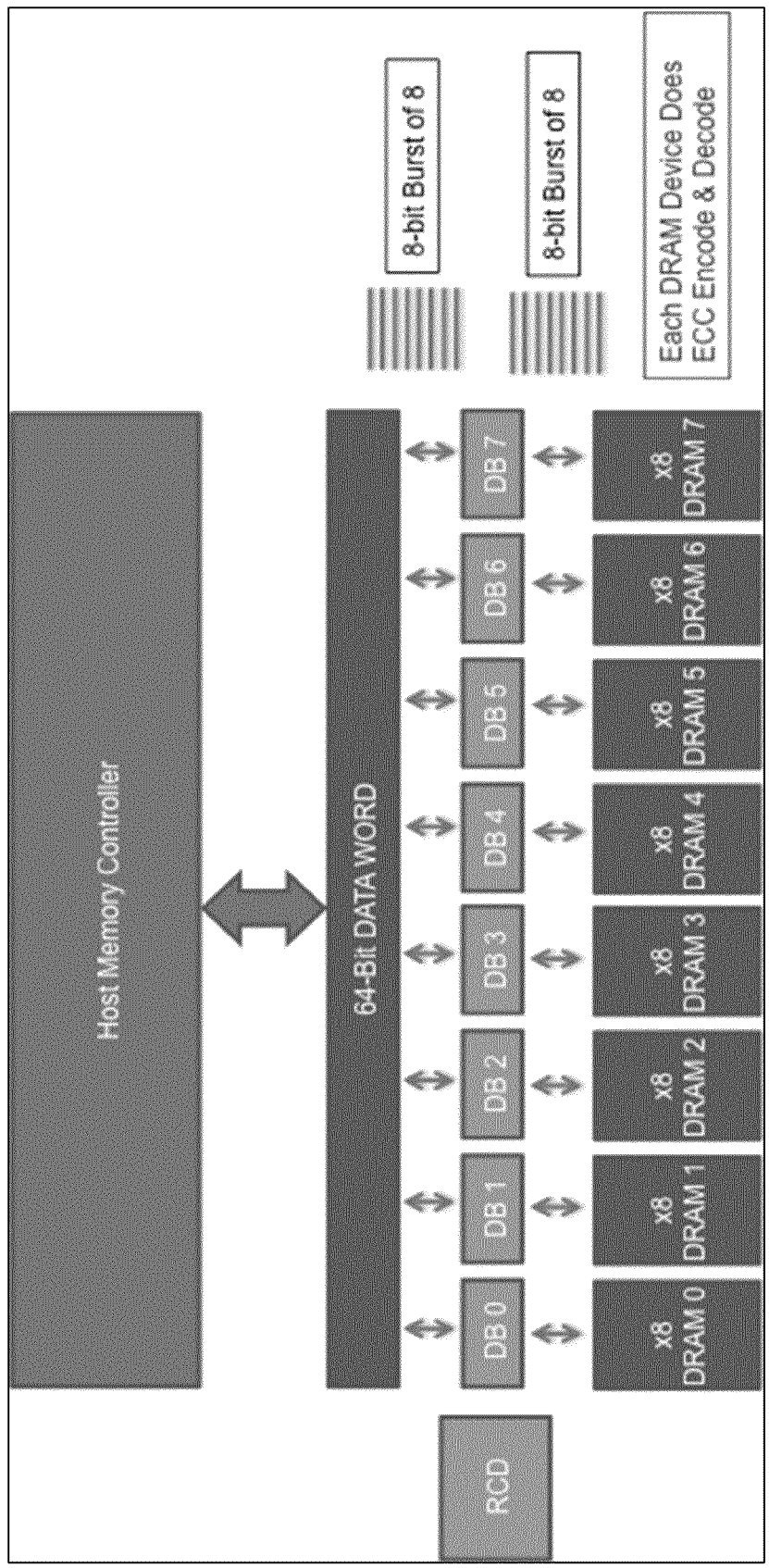

FIGS. 2 through 4 present four different system architectural implementation options (Option 1 through Option 4) for Vertical ECC. One constant in these four options is that they all require a new DRAM device design. In an example, FIG. 2 illustrates a Vertical ECC Architecture with Data Buffer & DRAM Device Design (Option 1). In FIG. 2, the memory data buffer (denoted by the DB blocks) interface to the DRAM devices changes in that it creates two extra data bursts (shown as two red lines) for each byte lane. Note that in this implementation, only eight ×8 DRAM devices are required comprising 8 byte lanes. The two extra bytes in the 8-bit burst of 10 forms the ECC check bits for the 8-byte data burst generated (per byte lane) by the host memory controller. From coding theory [1], it can be shown that these two extra bytes are sufficient to form a DEC-TED code. For a lower overhead system design, only one extra byte burst can be generated by the DB blocks allowing for SEC-DED code.

This extra burst generation is not an unreasonable implementation. In fact, the current DDR4 specification revision [2] specifies a burst of this type for Write cyclic redundancy check (CRC) transaction. The burst in the DDR4 spec is defined for checking link failures and not for memory cell errors. The specification [2] does not define a CRC burst transaction for read transactions. The DB blocks do both encoding and decoding of DEC-TED codes and correct potential single or double bit errors before presenting data to the host memory controller. One clear advantage of this approach is that error correction and detection capability is done on a per DRAM device basis and not across different DRAM devices. New DRAM devices are required that absorb the extra bursts by provisioning extra column bit lines in the memory array. The changes to the host memory controller are minimal. The host memory controller will see a latency impact (for read transactions) and a bandwidth impact on back-to-back read/write transactions. While FIG. 2 only shows ×8 DRAM devices, this implementation option for Vertical ECC also works with ×4 DRAM devices.

In an example, FIG. 3 illustrates a Vertical ECC Architecture with New Data Buffer & DRAM Device Design (Option 2). In FIG. 3, the architecture for Vertical ECC is similar to that of option 1 in that the DB blocks encode and decode ECC. However, instead of creating extra two byte bursts, the 8-bit burst from the host memory controller is converted to 10-bit burst by the DB blocks. This changes the interface requirement to the DRAM devices from ×8 to ×10. However, the storage overhead in the DRAM devices is still the same as that in option 1. The only difference is that the DRAM devices have to provision extra bit planes for the transition from an ×8 to an ×10 interface. The interface to the host memory controller does not change. In addition, this option mitigates the latency and bandwidth impact seen in option 1.

In FIG. 4, the DRAM device does both the encoding and decoding of the Vertical ECC. So in addition to provisioning extra column bit lines or bit planes the DRAM device architecture requires ECC encoding and decoding logic. From a system architecture perspective, this option 3 implementation has the least possible impact. The host memory controller design and the DB block design do not have to change except to support signaling conditions from the DRAM devices when errors are detected. The only possible consideration is that this option has the greatest possible impact on the DRAM device microarchitecture—as it has to combine both DRAM and logic process on the same wafer. In an example, FIG. 4 is a Vertical ECC Architecture with New DRAM Device Design (Option 3).

Figure 5:
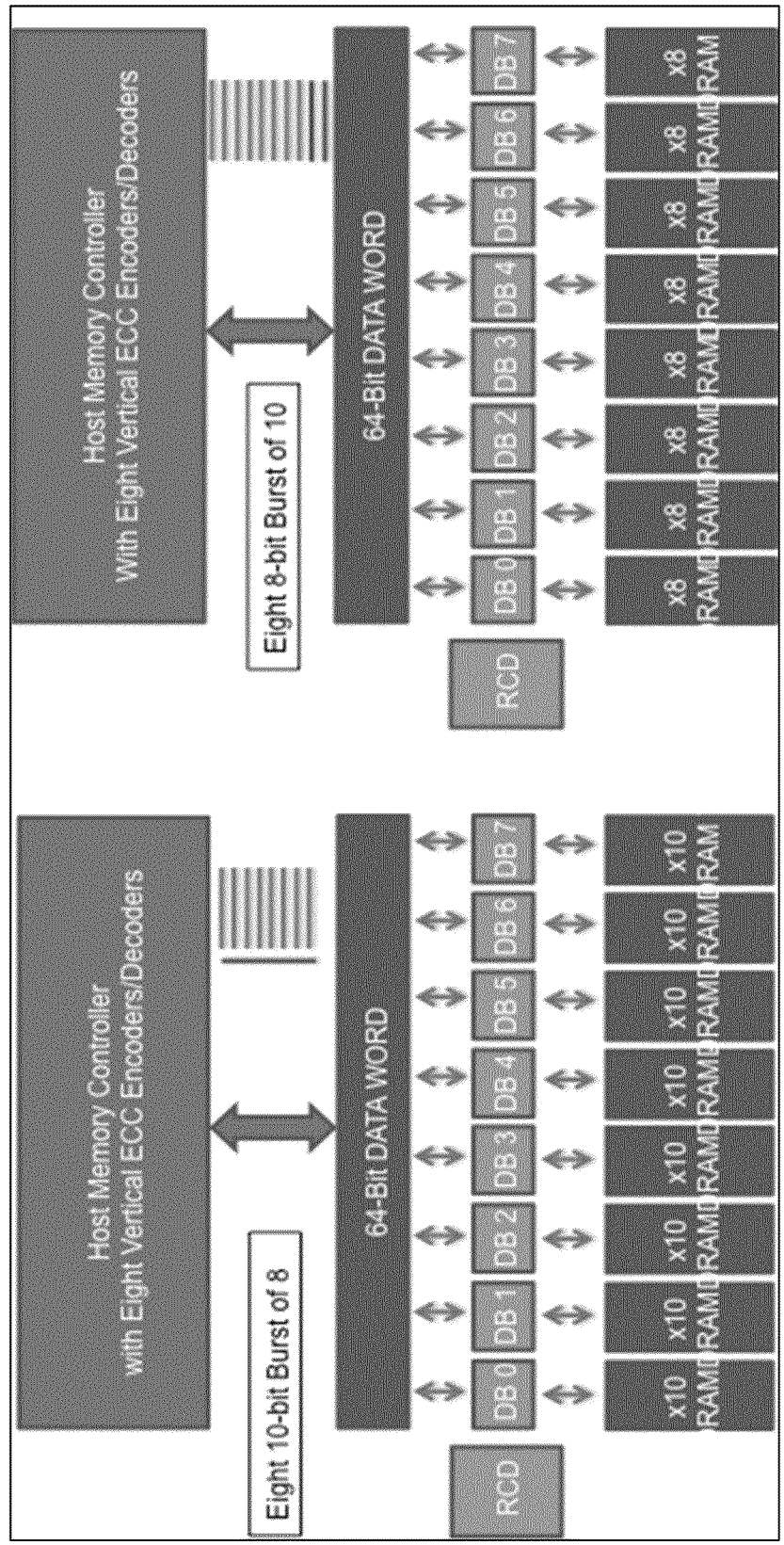
FIG. 5 displays the implementation of Option 4, wherein the host memory controller carries the burden of generating the extra bursts (8 to 10) or wider (×10 wide instead of ×8 wide) data width bursts.

Implementation Option 4 is presented in FIG. 5. In this option the host memory controller carries the burden of generating the extra bursts (8 to 10) or wider (×10 wide instead of ×8 wide) data width bursts. In addition both DB block and DRAM device designs have to change. One implementation flavor (FIG. 5: right hand side block diagram using burst of 10 bytes) has the same performance limitations as the option 1 implementation. This option 4 has the maximum system infrastructure impact. In an example, FIG. 5 is a Vertical ECC Architecture with New Memory Controller, Data Buffer, and DRAM Device Design (Option 4).

Figure 6:
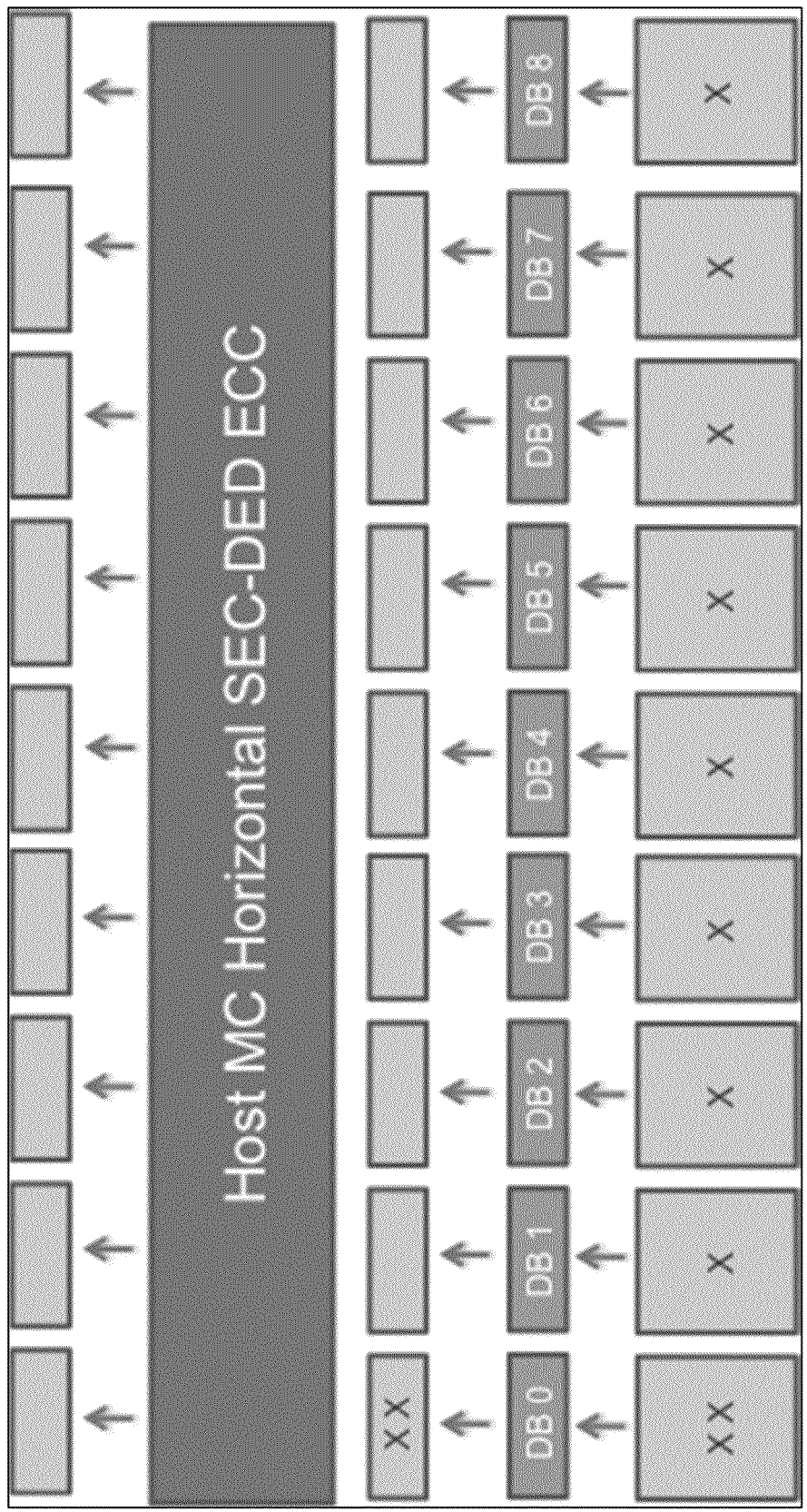
FIG. 6 is a DRAM Device Level RAID of Chip-Kill with Vertical & Horizontal ECC.

In an example, FIG. 6 is a DRAM Device Level RAID or Chip-Kill with Vertical & Horizontal ECC. While Vertical ECC method eliminates the need for Horizontal ECC, it does not preclude it. Combined with Horizontal ECC, DRAM device level RAID (also known as chip-kill) can be accomplished. This is demonstrated in the FIG. 6 illustration. FIG. 6 shows that even with a SEC-DED Vertical ECC code, DRAM device level RAID can be accomplished. This works as follows: All single-bit errors in the rightmost eight devices are corrected by the DB blocks. The double-bit error in the leftmost device is not corrected and is signaled to the host memory controller by the DB0 block. The host memory controller with its SEC-DED code and with the additional information about the failing DRAM device has enough decoding information to recover all of the failed bits in the lane corresponding to the DB0 block. If the Vertical ECC uses DEC-TED code then more errors can be recovered. In general, with Vertical ECC approach in general up to 16 errors can be corrected in a horizontal 64-bit word. Also, on a per DRAM device basis, significantly many SEUs and weak cell errors can be corrected. For example, in a 8 Gbit DRAM device using Vertical ECC approach up to O(108) weak-cell and SEUs can be corrected with a spread of no more than 2 bit errors per 64-bit burst.

Table 1 summarizes the advantages and disadvantages of the four Vertical ECC options. It appears that option 2 and option 3 seem like they are a more viable system architectural approach. If DRAM manufacturers can accommodate the logic for ECC encoding and decoding in the DRAM process, then option 3 is the most viable of the four.

TABLE 1

Implementation Options Impact Summary

| Option | Data Buffer | DRAM Device | Memory Controller | System |
|---|---|---|---|---|
| 1 | Support for ECC encoder/decoder. Unified handling of x4 and x8 configurations. | Memory array for extra columns. | No interface change required. Protocol change required to accommodate extra latency. | Latency and back-to-back read/write bandwidth impact. |
| 2 | Support for ECC encoder/decoder. Unified handling of x4 and x8 configurations. | Memory array for extra bit planes. Least impact on DRAM device microarchitecture. DRAM device architecture can work in horizontal ECC environments as well.1 | No interface change required. System performance impact mitigated with a retry options. | Minimal performance impact. |
| 3 | No change required | Memory array for extra bit planes. Different ECC designs for x4 and x8 configurations. Most impact on microarchitecture. Logic and DRAM process integration. | No change required. | No performance impact. |
| 4 | Extra burst or wider data width support. | Memory array for extra bit planes or extra columns. Least impact on DRAM device microarchitecture. | Parallel Vertical ECC Encoders/Decoders. Unified handling of x4 and x8 configurations. | Major infrastructure impact. No performance impact in x10 implementation. |

Vertical ECC methods are most applicable to future stack based DRAM device architectures.

BIBLIOGRAPHY

1. T. R. N. Rao and Eiji Fujiwara, Error-Control Coding for Computer Systems (Prentice Hall series in computer engineering), January 1989.
2. DDR4 SDRAM Component spec (JESD79-4), Draft Rev. 8/11

The embodiments of the invention described herein are exemplary and numerous modifications, variations and rearrangements can be readily envisioned to achieve substantially equivalent results, all of which are intended to be embraced within the spirit and scope of the invention as defined in the appended claims.

The invention claimed is:

1. A DIMM apparatus comprising:
a plurality of DRAM devices numbered from 0 through N−1, where N is an integer greater than seven (7), each of the DRAM devices is configured in a substrate module;
a buffer integrated circuit device comprising a plurality of data buffers (DB) numbered from 0 through N−1, where N is an integer greater than seven (7), each of the data buffers corresponds to one of the DRAM devices; and
a plurality of error correcting modules ("ECMs") associated with the plurality of data buffers, respectively, each of error correcting modules configured within each of the data buffers, each error correcting module being configured to correct a single or double bit error within each DRAM device,
wherein the ECM is configured to associate error correcting check bits with a first number of bursts created from a data buffer to the DRAM device based upon a second number of bursts received from a memory controller device, the first number of bursts greater than the second number of bursts.

2. Apparatus of claim 1 wherein the ECM is configured to associate error correcting check bits with one or more bursts from or to the DRAM device; and wherein the DB encode and decode a plurality of data bursts comprising actual data and error correcting check bits.

3. Apparatus of claim 1 wherein N is equal to 8; and wherein the ECM is configured to associate error check bits from two bursts from or to the DRAM device; the two bursts being two out of ten eight bit bursts to be characterized by a double error correcting (DEC) and triple error detecting (TED) capability.

4. A method for operating a DIMM apparatus, the apparatus comprising a plurality of DRAM devices numbered from 0 through N−1, where N is an integer greater than seven (7), each of the DRAM devices is configured in a substrate module; a buffer integrated circuit device comprising a plurality of data buffers (DB) numbered from 0 through N−1, where N is an integer greater than seven (7), each of the data buffers corresponds to one of the DRAM devices; and a plurality of error correcting modules ("ECMs") associated with the plurality of data buffers, respectively, each of error correcting modules configured within each of the data buffers, each error correcting module being configured to correct a single or double bit error within each DRAM device, the method comprising transferring one or more check bits with a first number of bursts created from a data buffer to the DRAM device based upon a second number of bursts received from a memory controller device, the first number of bursts greater than the second number of bursts; and encoding and decoding a plurality of data bursts comprising actual data and the error correcting check bits.

5. The method of claim 4 wherein N is equal to 8; and wherein the two bursts being two out of ten eight bit bursts to be characterized by a double error correcting (DEC) and triple error detecting (TED) capability.

6. The method of claim 4 wherein the first number of bursts is one greater than the second number of bursts.

7. The method of claim 6 wherein N is equal to eight.

8. The method of claim 6 wherein the ECM is configured to associate error check bits from one extra burst from or to the DRAM device; the extra burst being out of nine eight bit bursts to be characterized by a single error correcting (SEC) double error detecting (DED) code.

9. The method of claim 4 wherein the first number of bursts is two greater than the second number of bursts.

10. The method of claim 9 wherein N is equal to eight.

11. The method of claim 9 wherein the ECM is configured to associate error check bits from two extra bursts from or to the DRAM device; the two extra bursts being out of ten eight bit bursts to be characterized by a double error correcting (DEC) triple error detecting (TED) code.

12. The method of claim 9 wherein the two extra bursts are accommodated in a write cyclic redundancy check (CRC) transaction mechanism.

13. Apparatus of claim 1 wherein the first number of bursts is one greater than the second number of bursts.

14. Apparatus of claim 13 wherein N is equal to eight.

15. Apparatus of claim 13 wherein the ECM is configured to associate error check bits from one extra burst from or to the DRAM device; the extra burst being out of nine eight bit bursts to be characterized by a single error correcting (SEC) double error detecting (DED) code.

16. Apparatus of claim 13 wherein the extra burst is accommodated in a write cyclic redundancy check (CRC) transaction mechanism.

17. Apparatus of claim 1 wherein the first number of bursts is two greater than the second number of bursts.

18. Apparatus of claim 17 wherein N is equal to eight.

19. Apparatus of claim 17 wherein the ECM is configured to associate error check bits from two extra bursts from or to the DRAM device; the two extra bursts being out of ten eight bit bursts to be characterized by a double error correcting (DEC) triple error detecting (TED) code.

20. Apparatus of claim 17 wherein the two extra bursts are accommodated in a write cyclic redundancy check (CRC) transaction mechanism.

* * * * *